United States Patent
Yun

(10) Patent No.: US 7,782,679 B2
(45) Date of Patent: Aug. 24, 2010

(54) MEMORY DEVICE AND READING METHOD

(75) Inventor: In Suk Yun, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 86 days.

(21) Appl. No.: 11/958,375

(22) Filed: Dec. 17, 2007

(65) Prior Publication Data
US 2009/0003076 A1 Jan. 1, 2009

(30) Foreign Application Priority Data
Jun. 28, 2007 (KR) .................. 10-2007-0064394

(51) Int. Cl.
*G11C 16/06* (2006.01)
*G11C 7/02* (2006.01)

(52) U.S. Cl. .................. 365/185.21; 365/208

(58) Field of Classification Search ............ 365/185.21
See application file for complete search history.

(56) References Cited

U.S. PATENT DOCUMENTS

| | | | | |
|---|---|---|---|---|
| 6,097,638 | A * | 8/2000 | Himeno et al. | 365/185.25 |
| 7,259,992 | B2 * | 8/2007 | Shirota | 365/185.21 |
| 7,486,562 | B2 * | 2/2009 | Ogawa et al. | 365/185.21 |
| 7,518,925 | B2 * | 4/2009 | Kuramori | 365/185.18 |
| 2005/0243622 | A1 * | 11/2005 | Omoto | 365/203 |
| 2008/0062767 | A1 * | 3/2008 | Crippa et al. | 365/185.18 |
| 2009/0003077 | A1 * | 1/2009 | Lim | 365/185.21 |
| 2009/0040832 | A1 * | 2/2009 | Park | 365/185.19 |
| 2009/0040834 | A1 * | 2/2009 | Ogawa | 365/185.21 |

FOREIGN PATENT DOCUMENTS

| | | | |
|---|---|---|---|
| KR | 1020010001974 A | 1/2001 |
| KR | 1020010044901 A | 6/2001 |
| KR | 1020070013890 A | 1/2007 |

* cited by examiner

*Primary Examiner*—Son L Mai
(74) *Attorney, Agent, or Firm*—Townsend and Townsend and Crew LLP

(57) ABSTRACT

A memory device according to an embodiment of the present invention, comprises a common source line current detection unit for detecting current in a common source line of a memory cell array and outputting a control signal; and a control unit for controlling an evaluation time for reading data of a page buffer coupled to the memory cell array according to the control signal output from the common source line current detection unit.

21 Claims, 4 Drawing Sheets

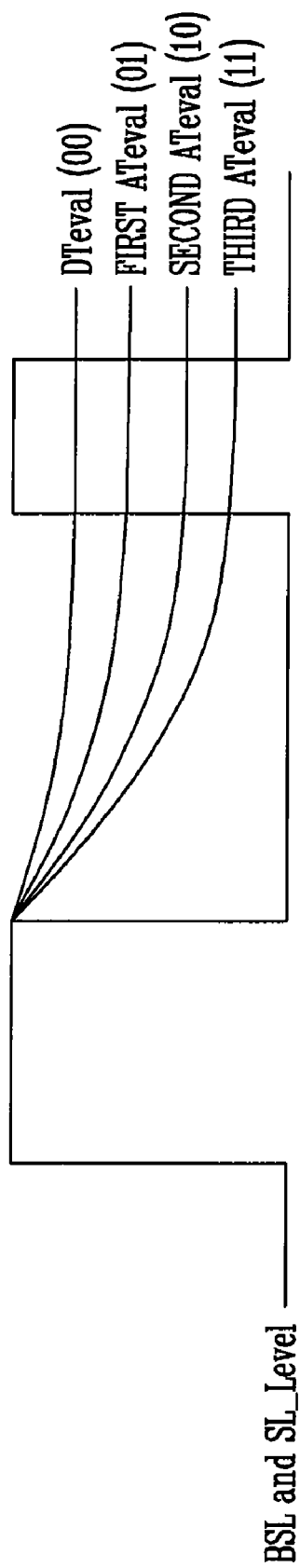

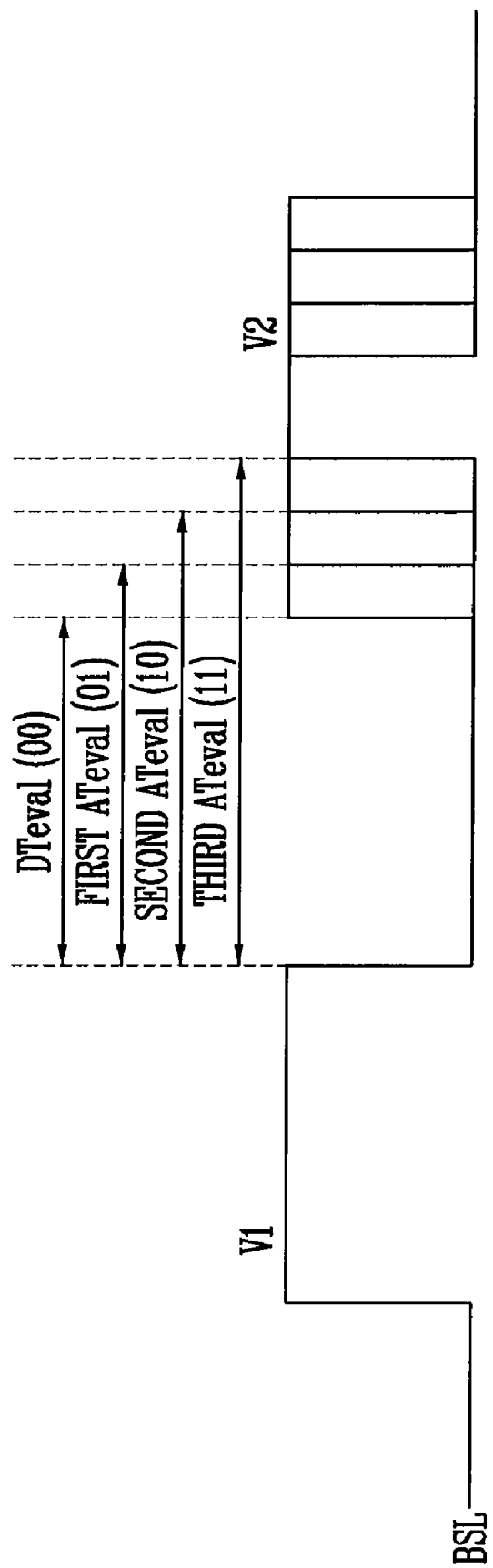

MEMORY DEVICE AND READING METHOD

CROSS-REFERENCES TO RELATED APPLICATIONS

The present application is based on, and claims priority from, Korean Application Serial Number 2007-64394, filed on Jun. 28, 2007, the disclosure of which is hereby incorporated by reference herein in its entirety.

BACKGROUND OF THE INVENTION

The present invention relates generally to reading of data of a memory device and, more particularly, to a memory device and a reading method which use read evaluation time differently according to the amount of current flowing in a common source line.

A NAND flash memory device which is a kind of memory device, includes a memory cell array, a row decoder and a page buffer. The memory cell array consists of a plurality of word lines extending along rows, a plurality of bit lines extending along columns, and a plurality of cell strings corresponding to the bit lines.

On one side of the memory cell array, the row decoder is coupled to string selection lines, word lines and common source lines. The other side of the memory cell array includes a page buffer coupled to a plurality of bit lines.

Recently, in order to improve the integration degree of such a flash memory, research for a multi level cell allowing one memory cell to store a large amount of data is being actively conducted. The memory cell is called a Multi Level Cell (hereinafter referred to as a MLC).

Each of the flash memory cells of the NAND flash memory device is composed of a current path formed between a source and a drain in a semiconductor substrate, a floating gate formed between isolation films on the semiconductor substrate and a control gate. Furthermore, programming for the flash memory cells is performed by grounding the source/drain regions of the memory cell and the semiconductor substrate, that is, bulk areas, and applying a positive high voltage to the control gate, thereby causing Flower-Nordheim Tunneling (hereinafter referred to as F-N tunneling). The F-N tunneling is a phenomenon in which electrons of the bulk areas are accumulated on the floating gate due to the electronic field of the high voltage applied to the control gate, so that the threshold voltage of the memory cell is increased.

The reading of data stored in the flash memory device is performed by pre-charging bit lines and then pre-charging the detection node of a page buffer (not shown) in a high level after a first initiation has been performed.

Thereafter, a selection signal having a level V1 is input in order to turn on the bit line selection transistor of the bit line selection unit of the page buffer.

Therefore, the selected bit line becomes an electric potential resulting from subtracting a threshold voltage Vt from the voltage V1. Thereafter, the pre-charge voltage applied to the sensing node is turned off, and the bit line selection signal having a level V2 is applied to the selected bit line selection transistor. In this case, when the electric potential of the bit line coupled to a word line is lower than V2−Vt, the bit line selection transistor is turned off, thereby maintaining the detection node at a high level. When the electric potential of the bit line coupled to a word line is higher than V2−Vt, the bit line selection transistor is turned on, thereby causing the electric potential to be changed through charge sharing with the detection node. A time for waiting for a change in the electric potential with the sensing node after the voltage V2 has been applied to the bit line selection transistor is called read evaluation time.

There may be a case in which, during a read operation, the data of the memory cell is not all read during the read evaluation time due to the bouncing of a source line. That is, during continuous execution of read commands, an amount of current flows to a global source line according to the cell strings coupled to the bit lines. In this case, the source line can not be maintained at 0V due to the current flowing in the source line, thereby causing bouncing.

Due to the bouncing, the voltage of the source line is higher than 0V. Thus, there may be a problem in that, when the erased cell is read, the state of the cell may not be accurately read using only the flowing current within the read evaluation time due to the decreased amount of the current of the cell strings.

SUMMARY OF THE INVENTION

The object of the present invention is to provide a memory device and a reading method which controls a read evaluation time according to the amount of current flowing in a source line in the memory device, thereby allowing the accurate reading of data even in the case in which source bouncing occurs.

To achieve the above object, a memory device according to an embodiment of the present invention, comprises a common source line current detection unit for detecting current of a common source line of a memory cell array and outputting a control signal; and a control unit for controlling evaluation time for reading of data of a page buffer coupled to the memory cell array in response to the control signal output from the common source line current detection unit.

The common source line current detection unit comprises a current detector for detecting the current of the common source line and outputting control current according to a difference with a preset reference voltage; and an evaluation time selection unit for outputting the evaluation time information according to a magnitude of the control current output by the current detector.

The current detector comprises a source line current detecting unit coupled to the common source line for detecting the current; and a reference current generating unit coupled to the source line current detecting unit for generating a preset reference current.

The source line current detecting unit detects the current of the common source line through a current mirror coupled to the common source line.

The evaluation time selection unit comprises an analog digital converter for outputting the magnitude of the control current output by the current detector as a digital value; and a decoder for selecting pre-stored evaluation time information according to the digital value output by the analog digital converter.

The evaluation time selection unit further comprises a register unit for storing the evaluation time information.

The magnitude of the control current input to the analog digital converter is an amount of current according to the difference between the current of the common source line and the reference current.

The evaluation time selection unit outputs a larger read evaluation time when the magnitude of the control current output by the current detector increases.

A memory device according to another embodiment of the present invention, comprises a memory cell array having a plurality of cell strings and a plurality of memory cells serially coupled to each other, the cell strings being coupled to bit lines and a common source line; a page buffer unit having a plurality of page buffer circuits which are coupled to the bit lines and perform programming and reading of data of a memory cell selected among the plurality of memory cells; a current detection unit for detecting a current of the common source line of the memory cell array; an evaluation time selection unit for outputting evaluation time information according to a magnitude of a control current output by the common source line current detection unit; and a control unit for controlling an evaluation time for the page buffer unit according to the evaluation time information output by the evaluation time selection unit.

The current detector comprises a source line current detecting unit coupled to the common source line for detecting the current; and a reference current generating unit coupled to the source line current detecting unit for generating a preset reference current.

The evaluation time selection unit comprises an analog digital converter for outputting the magnitude of the control current output by the current detector as a digital value; and a decoder for selecting pre-stored evaluation time information according to the digital value output by the analog digital converter.

The evaluation time selection unit further comprises a register unit for storing the evaluation time information.

The magnitude of the control current input to the analog digital converter is an amount of current according to a difference between the current of the common source line and the reference current.

The evaluation time selection unit outputs a larger read evaluation time when the magnitude of the control current output by the current detector increases.

The source line current detecting unit detects the current in the common source line through a current mirror coupled to the common source line.

A reading method for a memory device according to the present invention comprises performing a read operation; detecting a current of a common source line during the read operation; and controlling a read evaluation time preset according to an amount of the current of the common source line.

The read evaluation time is a time for evaluating data of a memory cell at a sensing node.

The reading method further comprises increasing the read evaluation time when a detected amount of the current of the common source line is increased.

The reading method further comprises converting an amount of current of the common source line into a digital value; determining the read evaluation time respectively defined for the converted digital values to be the read evaluation time of the memory device and then performing another read operation.

The reading method further comprises using a preset default read evaluation time when performing an initial read operation of the memory device.

The amount of the current of the common source line is detected based on the difference with a preset reference current.

BRIEF DESCRIPTION OF THE DRAWINGS

For a better understanding of the nature and objects of the present invention, reference should be made to the following detailed description with the accompanying drawings, in which:

FIG. 2 is a diagram illustrating a digital conversion according the current of the source line according to an embodiment of the present invention; and FIG. 3 is a diagram illustrating a change of read evaluation time according to the current of the source line.

DESCRIPTION OF SPECIFIC EMBODIMENTS

Hereinafter, preferred embodiments of the present invention will be described in detail with reference to the accompanying drawings. However, the present invention is not limited to the embodiments set forth herein but can be implemented in different forms. Rather, the preferred embodiments are merely provided to allow the present invention to be completely described herein and to fully convey the scope of the invention to those skilled in the art.

Figure 1A:
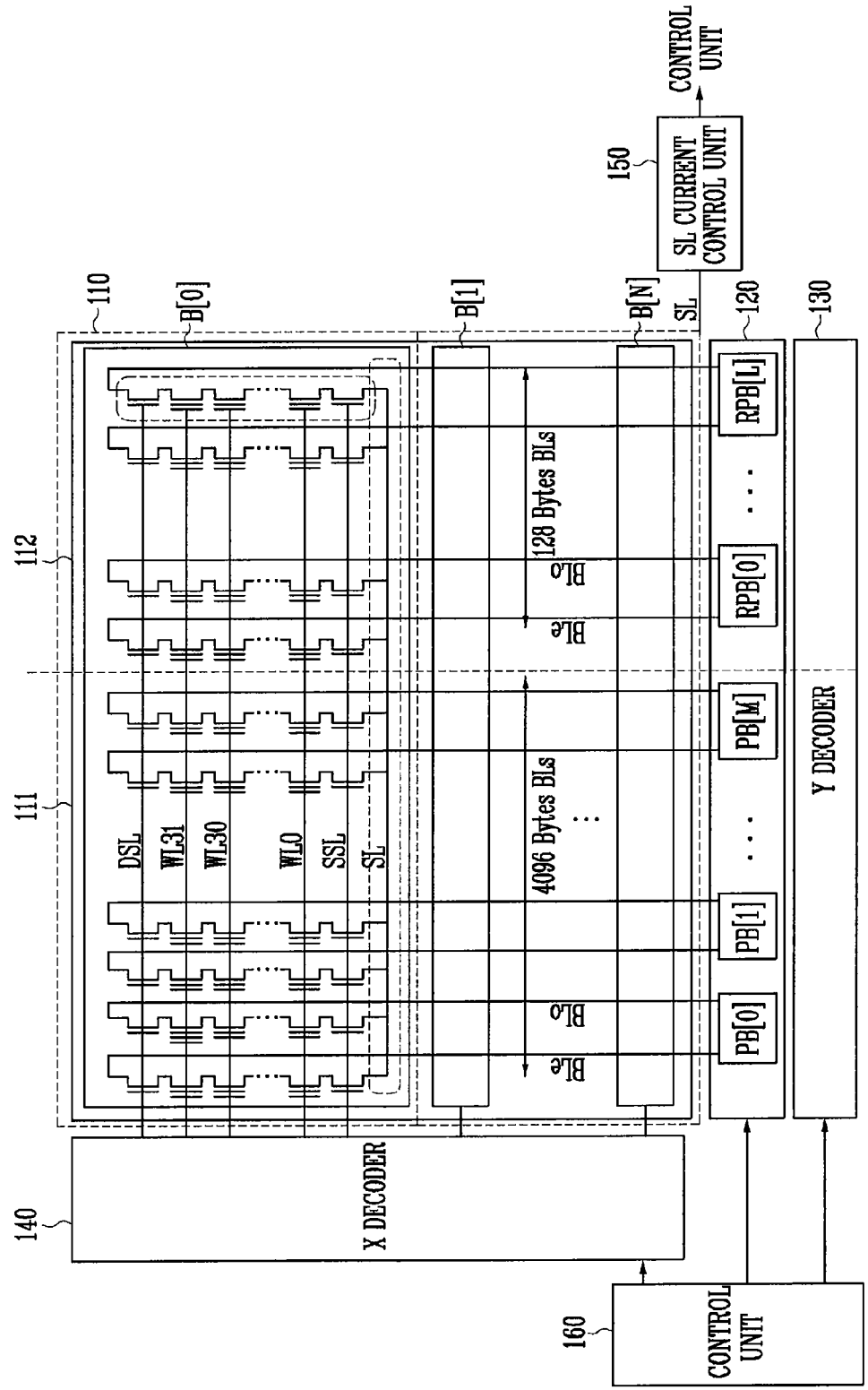
FIG. 1A is a block diagram illustrating a NAND flash memory device according to the present invention.

FIG. 1A is a block diagram illustrating a NAND flash memory device according to the present invention. Referring to FIG. 1A, the flash memory device 100 includes a memory cell array 110, a page buffer unit 120, an Y decoder 130, a X decoder 140, a Source Line (SL) current detection unit 150 and a control unit 160. FIG. 1A illustrates the block diagram of a part of the NAND flash memory device.

The memory cell array 110 includes a main array 111 for data storage, and a redundancy cell array 112 used to replace a column having defective memory cells. The memory cell array 110 includes a plurality of cell strings, in each of which a plurality of memory cells are coupled serially to each other. The cell strings are respectively coupled to bit lines.

The bit lines are coupled so that adjacent bit lines form a pair of even and odd bit lines. Each pair of bit lines is coupled to the page buffer circuit of the page buffer unit 120.

Furthermore, the memory cell array 110 is divided into block units, and includes N memory blocks B[0] to B[N].

The page buffer unit 120, includes a plurality of page buffer circuits respectively coupled to pairs of bit lines as described above. The page buffer unit 120 includes first to M page buffers PB[0] to PB[M] coupled to the main array 111 and first to L page buffers RPB[1] to RPB[L] coupled to the redundancy cell array 112.

The Y decoder 130 is coupled to the page buffer unit 120 and performs a switching operation for input and output of data according to input addresses. The X decoder 140 selects the word lines of the memory cell array 110 according to the input addresses.

The SL current detection unit 150 measures the current of the common source line (SL) of the memory cell array 110 and outputs a control signal proportional to the amount of the current. The SL current detection unit 150 also controls the evaluation time for reading data of the NAND flash memory device 100 in response to the control signal output from the SL current detection unit 150.

The evaluation time for reading is adjusted according to the control signal output by the SL current detection unit 150, thereby making accurate data reading possible. The SL current detection unit 150 is configured as described below.

Figure 1B:
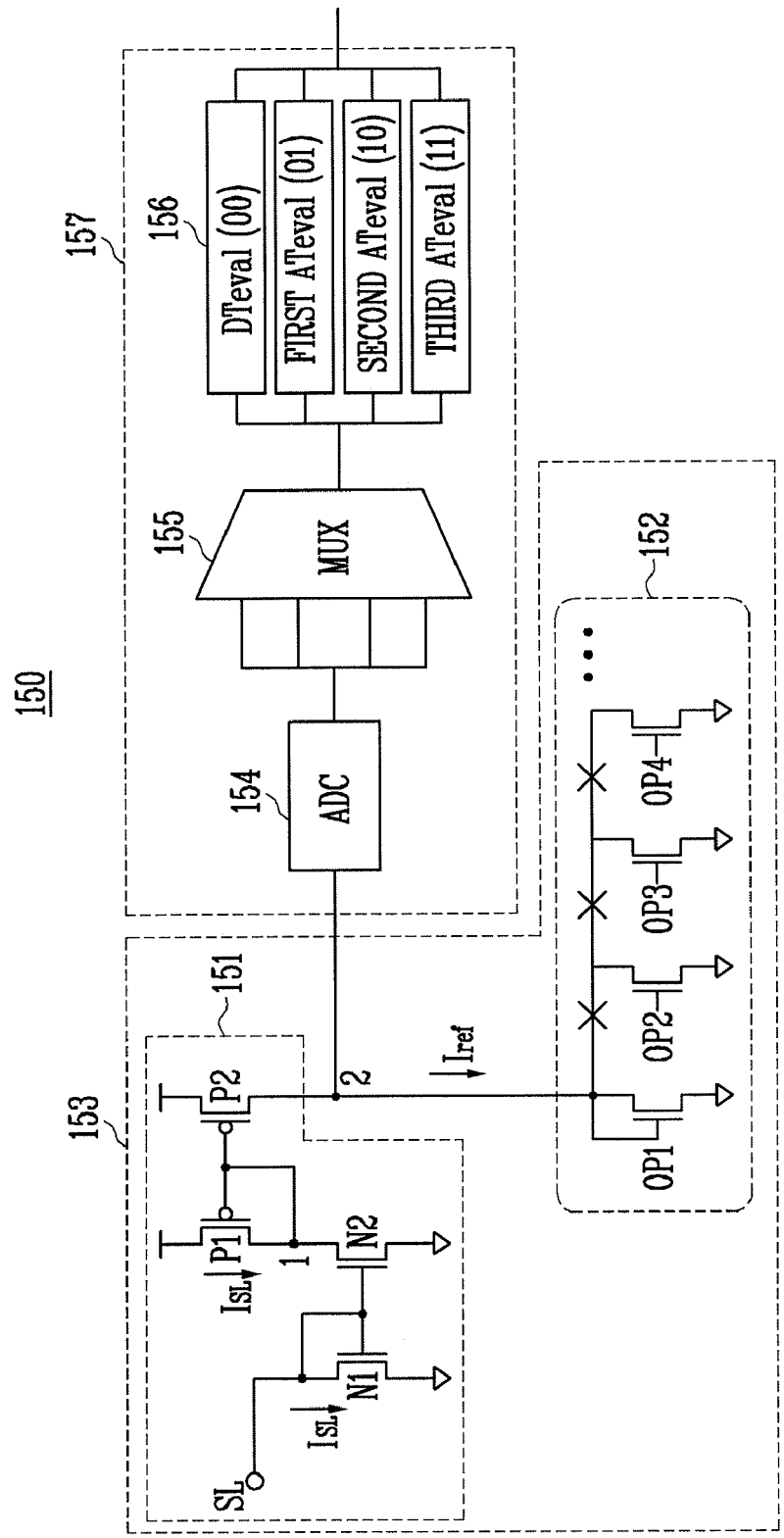
FIG. 1B is a detailed circuit diagram of the SL current detection unit of FIG. 1A.

FIG. 1B is a detailed circuit diagram of the SL current detection unit of FIG. 1A.

Referring to FIG. 1B, the SL current detection unit 150 of the flash memory device according to an embodiment of the present invention includes a current detector 153 for measuring the current of the SL, and an evaluation time selection unit 157 for outputting the control signal proportional to the magnitude of the current of the SL measured by the current detector 153.

The current detector 153 includes a source line current detecting unit 151 and a reference current generating unit 152. The evaluation time selection unit 157 includes an Analog Digital Converter (ADC) 154, a decoder 155 and a register unit 156. The register unit 156 stores pieces of data read time information (DTeval) first ATeval to third ATeval of the NAND flash memory device 100 selected by the decoder 155.

The source line current detecting unit 151 includes first and second PMOS transistors P1 and P2, and first and second NMOS transistors N1 and N2. Furthermore, the reference current generating unit 152 includes a number of NMOS transistors. The control current for controlling the evaluation time is output at the contact point between the source line current detecting unit 151 and the reference current generating unit 152 of the current detector 153, and is input to the evaluation time selection unit 157.

The ADC 154 outputs a digital value proportional to the magnitude of the control current output from the current detector 153, and the decoder 155 decodes the digital value output from the ADC 154 and selects the register unit 156. The register unit 156 delivers the values of registers selected according to the selection signals of the decoder 155 to the control unit 160 which controls the operation of the NAND flash memory device 100. The control unit 160 which performs control for operation, which is included in the NAND flash memory device 100, adjusts the evaluation time for reading data of the NAND flash memory device 100 according to the signals output from the register unit 156, according to an embodiment of the present invention.

The register unit 156 stores read evaluation time information selected according to the selection signals of the decoder 155 as described above, and in particular, stores default time DTeval which is default evaluation time information at the stage in which SL bouncing does not occur, and first to third additional time information ATeval.

Therefore, four pieces of evaluation time information are output according to the selection signals output from the decoder 155.

In the source line current detecting unit 151, the first NMOS transistor N1 is coupled to a node SL connected to the common source line and ground, the second NMOS transistor N2 is coupled to the first node 1 and ground, and the gates of the first NMOS transistor N1 and the second NMOS transistor N2 are coupled to each other and further to the node SL, thereby forming a current mirror.

The first PMOS transistor P1 is coupled to a power supply voltage and the first node 1, the second PMOS transistor P2 is coupled to a power supply voltage and the second node 2, and the gates of the first PMOS transistor P1 and the second PMOS transistor P2 are coupled to each other and further to the first node 1. The first and second PMOS transistors P1 and P2 are coupled to the current mirror.

Therefore, current $I_{SL}$ flowing in the source line SL becomes substantially identical to current flowing in the first PMOS transistor P1 due to the current mirror. Furthermore, current flowing in the second PMOS transistor P2 becomes substantially identical to the current flowing in the first PMOS transistor P1

In the reference current generating unit 152, a plurality of NMOS transistors are coupled in parallel to each other between the second node 2 and ground. The number of the NMOS transistors is adjusted so as to make a reference current match characteristics of the NAND flash memory 100.

The number of the NMOS transistors of the reference current generating unit 152 is determined to set a reference current according to the characteristics of the NAND flash memory 100 through simulation.

The magnitude of the reference current $I_{ref}$ flowing to reference current generating unit 152 is changed according to current flowing in the second PMOS transistor P2. Thus, the magnitude of current flowing in the first node 2 is changed.

In other words, since current generally does not flow in the second PMOS transistor P2 in the case where SL bouncing does not occur, the ADC 154 outputs a digital value according to the magnitude of the reference current $I_{ref}$ flowing to the reference current generating unit 152, and the decoder 155 outputs the digital value as two bit selection signals. In this embodiment of the present invention, the selection signal is output as a value (00) in the state in which SL bouncing does not occur.

Furthermore, when SL bouncing occurs, and current flows in the second PMOS transistor P2, the current value of the second node 2 is changed, and the decoder 155 outputs the digital value output by the ADC 154 as (01), (10) and (11) in that order. As the degree of bouncing increases, the current in the SL line increases, so that current flowing in the second PMOS transistor P2 also increases.

The more the magnitude of the current in the second PMOS transistor P2 increases, the more the magnitude of the current in the second node 2 decreases because the reference current $I_{SL}$ is offset.

The more the magnitude of the current of the second node 2 decreases, the larger the digital value that is output. In this embodiment of the present invention, as described above, the decoder 155 performs outputting values in the order of (01), (10) and (11), as the magnitude of the current decreases. The read evaluation time information of the register unit 156 is selected according to four digital values (00, 01, 10, 11) output by the decoder 155.

The register unit 156 outputs the stored read evaluation time according to the selection signal of the decoder 155. The read evaluation time is determined to be the default time DTeval in the state in which SL bouncing does not occur, and is determined to be increased to the third additional time ATeval according to the degree of bouncing.

When the selection signal is value (00), the read evaluation time is set according to the default time DTeval. When the selection signal is value (01), the read evaluation time is set to the first additional time, that is, the first ATeval. When the selection signal is value (10), the read evaluation time is set to the second additional time, that is, the second ATeval. When the selection signal is value (11), the read evaluation time is set to the third additional time, that is, the third ATeval.

FIG. 2 is a diagram illustrating a digital conversion according to the current of the source line according to an embodiment of the present invention. FIG. 3 is a diagram illustrating a change of the read evaluation time according to the current of the source line.

Referring to FIGS. 2 and 3, the decoder 155 outputs the selection signal based on the digital value output by the ADC 154 according to the current of the source line and the digital output value from the ADC 154. The decoder 155 then selects the evaluation time of the register unit 156.

The evaluation time selected by the register unit 156 is delivered to the control unit 160. The control unit 160 controls the read evaluation time of the NAND flash memory device to be proportional to the degree of SL bouncing according to the delivered evaluation time information.

As described above, the memory device and reading method according to the present invention detects bouncing when the bouncing occurs due to repeated read operations in a Source Line (SL), and adjusts the read evaluation time according to the degree of bouncing thereby making an accurate data read possible even though SL bouncing occurs.

Although the present invention has been described in preferred embodiment, it is not intended to limit the invention thereto. Those who are skilled in this technology can still make various alterations and modifications without departing from the scope and spirit of this invention.

What is claimed is:

1. A memory device comprising:
    a common source line current detection unit for detecting current in a common source line of a memory cell array and outputting a control signal; and
    a control unit for controlling an evaluation time for reading data of a page buffer coupled to the memory cell array according to the control signal output from the common source line current detection unit.

2. The memory device as defined in claim 1, wherein the common source line current detection unit comprises:
    a current detector for detecting the current in the common source line and outputting control current according to a difference with a preset reference voltage; and
    an evaluation time selection unit for outputting evaluation time information according to a magnitude of the control current output by the current detector.

3. The memory device as defined in claim 2, wherein the current detector comprises:
    a source line current detecting unit coupled to the common source line for detecting the current; and
    a reference current generating unit coupled to the source line current detecting unit for generating a preset reference current.

4. The memory device as defined in claim 3, wherein the source line current detecting unit detects the current of the common source line through a current mirror coupled to the common source line.

5. The memory device as defined in claim 2, wherein the evaluation time selection unit comprises:
    an analog digital converter for outputting the magnitude of the control current output by the current detector as a digital value; and
    a decoder for selecting pre-stored evaluation time information according to the digital value output by the analog digital converter.

6. The memory device as defined in claim 5, wherein the evaluation time selection unit further comprises a register unit for storing the evaluation time information.

7. The memory device as defined in claim 5, wherein the magnitude of the control current input to the analog digital converter is an amount of current according to a difference between the current of the common source line and a reference current.

8. The memory device as defined in claim 5, wherein the evaluation time selection unit outputs a larger read evaluation time when the magnitude of the control current output by the current detector increases.

9. A memory device comprising:
    a memory cell array having a plurality of cell strings and a plurality of memory cells serially coupled to each other, wherein the cell strings are coupled to bit lines and a common source line;
    a page buffer unit having a plurality of page buffer circuits which are coupled to the bit lines and perform programming and reading of data of a memory cell selected among the plurality of memory cells;
    a current detection unit for detecting current in the common source line of the memory cell array;
    an evaluation time selection unit for outputting evaluation time information according to a magnitude of a control current output by the current detection unit; and
    a control unit for controlling evaluation time for the page buffer unit according to the evaluation time information output by the evaluation time selection unit.

10. The memory device as defined in claim 9, wherein the current detection unit comprises:
    a source line current detecting unit coupled to the common source line for detecting the current; and
    a reference current generating unit coupled to the source line current detecting unit for generating a preset reference current.

11. The memory device as defined in claim 9, wherein the evaluation time selection unit comprises:
    an analog digital converter for outputting the magnitude of the control current output by the current detector as a digital value; and
    a decoder for selecting pre-stored evaluation time information according to the digital value output by the analog digital converter.

12. The memory device as defined in claim 11, wherein the evaluation time selection unit further comprises a register unit for storing the evaluation time information.

13. The memory device as defined in claim 11, wherein the magnitude of the control current input to the analog digital converter is an amount of current according to a difference between the current of the common source line and the reference current.

14. The memory device as defined in claim 11, wherein the evaluation time selection unit outputs a larger read evaluation time when the magnitude of the control current output by the current detector increases.

15. The memory device as defined in claim 10, wherein the source line current detecting unit detects the current in the common source line through a current mirror coupled to the common source line.

16. A reading method for a memory device, the reading method comprising:
    performing a read operation;
    detecting current in a common source line during the read operation; and
    controlling a read evaluation time preset according to an amount of the current of the common source line.

17. The reading method as defined in claim 16, wherein the read evaluation time is a time for evaluating data of the memory cell at a sensing node.

18. The reading method as defined in claim 16, further comprising increasing the read evaluation time when a detected amount of the current of the common source line is increased.

19. The reading method as defined in claim 16, further comprising:
    converting an amount of current of the common source line into a digital value; and
    determining the read evaluation time respectively defined for converted digital values to be the read evaluation time of the memory device and then performing another read operation.

20. The reading method as defined in claim 16, further comprising using a preset default read evaluation time when performing an initial read operation of the memory device.

21. The reading method as defined in claim 16, wherein the amount of the current in the common source line is detected based on a difference with a preset reference current.

* * * * *